United States Patent
Wang

(10) Patent No.: US 7,049,853 B2
(45) Date of Patent: May 23, 2006

(54) RESETABLE CONTROL CIRCUIT DEVICES FOR SENSE AMPLIFIERS

(75) Inventor: Tao-Ping Wang, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/689,922

(22) Filed: Oct. 20, 2003

(65) Prior Publication Data

US 2005/0083088 A1 Apr. 21, 2005

(51) Int. Cl.
*H03F 3/45* (2006.01)
(52) U.S. Cl. .............................. 327/51; 327/54; 327/57
(58) Field of Classification Search .................. 327/51, 327/52, 54, 57, 218; 365/205, 207, 208
See application file for complete search history.

(56) References Cited

U.S. PATENT DOCUMENTS

| | | | | |
|---|---|---|---|---|
| 4,912,423 A | * | 3/1990 | Milkovic et al. ............... | 330/9 |
| 5,412,348 A | * | 5/1995 | Kasha et al. ................ | 330/288 |
| 5,565,761 A | * | 10/1996 | Hwang ........................ | 323/222 |
| 5,671,458 A | * | 9/1997 | Kubo et al. .................. | 396/436 |
| 5,739,652 A | * | 4/1998 | Sriram ........................ | 318/439 |
| 6,392,957 B1 | | 5/2002 | Shubat et al. ............... | 365/233 |
| 6,400,186 B1 | | 6/2002 | Bailey et al. .................. | 327/55 |
| 6,462,553 B1 | * | 10/2002 | Badura ........................ | 324/459 |
| 6,535,019 B1 | * | 3/2003 | De Santis .................... | 326/83 |
| 6,574,146 B1 | * | 6/2003 | Micheloni et al. ........ | 365/185.2 |
| 6,744,296 B1 | * | 6/2004 | Chen et al. .................. | 327/231 |

OTHER PUBLICATIONS

Kobayashi et al., "A Current-Controlled Latch Sense Amplifier And A Static Power-Saving Input Buffer For Low-Power Architecture," IEEE Journal Of Solid-State Circuits, vol. 28, No. 4, Apr. 1993.

* cited by examiner

*Primary Examiner*—Tuan T. Lam
*Assistant Examiner*—Hiep Nguyen
(74) *Attorney, Agent, or Firm*—Duane Morris LLP

(57) ABSTRACT

A device to control a sense amplifier comprise a resetable control circuit containing a first input, a second input, a third input, and an output; the first input coupled to the output or to a ground; the second input coupled to receive a start signal; the third input coupled to receive output signals of the sense amplifier; the output coupled to the sense amplifier.

20 Claims, 4 Drawing Sheets

US 7,049,853 B2

RESETABLE CONTROL CIRCUIT DEVICES FOR SENSE AMPLIFIERS

FIELD OF THE INVENTION

The present invention relates to control circuit devices and more particularly to resetable control circuit devices for sense amplifiers.

BACKGROUND

A sense amplifier is enabled by a sense amplifier enabling signal (SAE). It is common that a SAE uses a pulse signal to control a sense amplifier, particularly in a low power SRAM circuit. A sense amplifier is employed to amplify the difference of input signals. As a result, when a sense amplifier turns on and receives input signals with slight voltage difference, output signals of a sense amplifier are differentiated to a predetermined level, for example VDD and GND, that can be recognized by other circuits.

SAE sometimes comes from a pseudo word-line signal. Before a pseudo word-line signal is coupled to SAE to enable a sense amplifier, however, a pseudo word-line signal usually goes through a delay chain circuit. The pulse width of the SAE is determined by the delay chain circuit. Consequently, a sense amplifier can not be timely turned off after outputs of the sense amplifier reach the predetermined level.

It is desired that a control circuit device that can turn off a sense amplifier after it detects that outputs of the sense amplifier reaches a predetermined voltage level. Dynamic circuits can be used to control a sense amplifier. It can turn off a sense amplifier after it detects that outputs of the sense amplifier reach a predetermined level. However, it causes short circuit currents and increases power consumption.

SUMMARY OF THE INVENTION

A device to control a sense amplifier comprise a resetable control circuit containing a first input, a second input, a third input, and an output; the first input coupled to the output or to a ground; the second input coupled to receive a start signal; the third input coupled to receive output signals of the sense amplifier; and the output coupled to the sense amplifier.

BRIEF DESCRIPTION OF THE DRAWINGS

A more complete understanding of the present invention can be obtained by reference to the detailed description of embodiments in conjunction with the accompanying drawings, in which.

DETAILED DESCRIPTION

This description of the exemplary embodiments is intended to be read in connection with the accompanying drawings, which are to be considered part of the entire written description. In the description, terms such as "coupled to" and "connected to" should be construed to refer to a relationship wherein components are secured or attached to one another either directly or indirectly through intervening structures for electronic signals to transfer, unless expressly described otherwise. A "resetable control circuit" should be construed to refer to any static circuit that is able to reset its output to an initial condition. A "start signal" should be construed to refer to a pulse used to trigger a resetable control circuit for generating an output signal. A "D flip-flop" circuit should be construed to refer to a circuit that has a layout similar to D flip-flop circuit but is used for sense amplifier control, not for traditional flip-flop function. The terms "low" and "high" refer to the voltage level of signals in a circuit.

Figure 1:
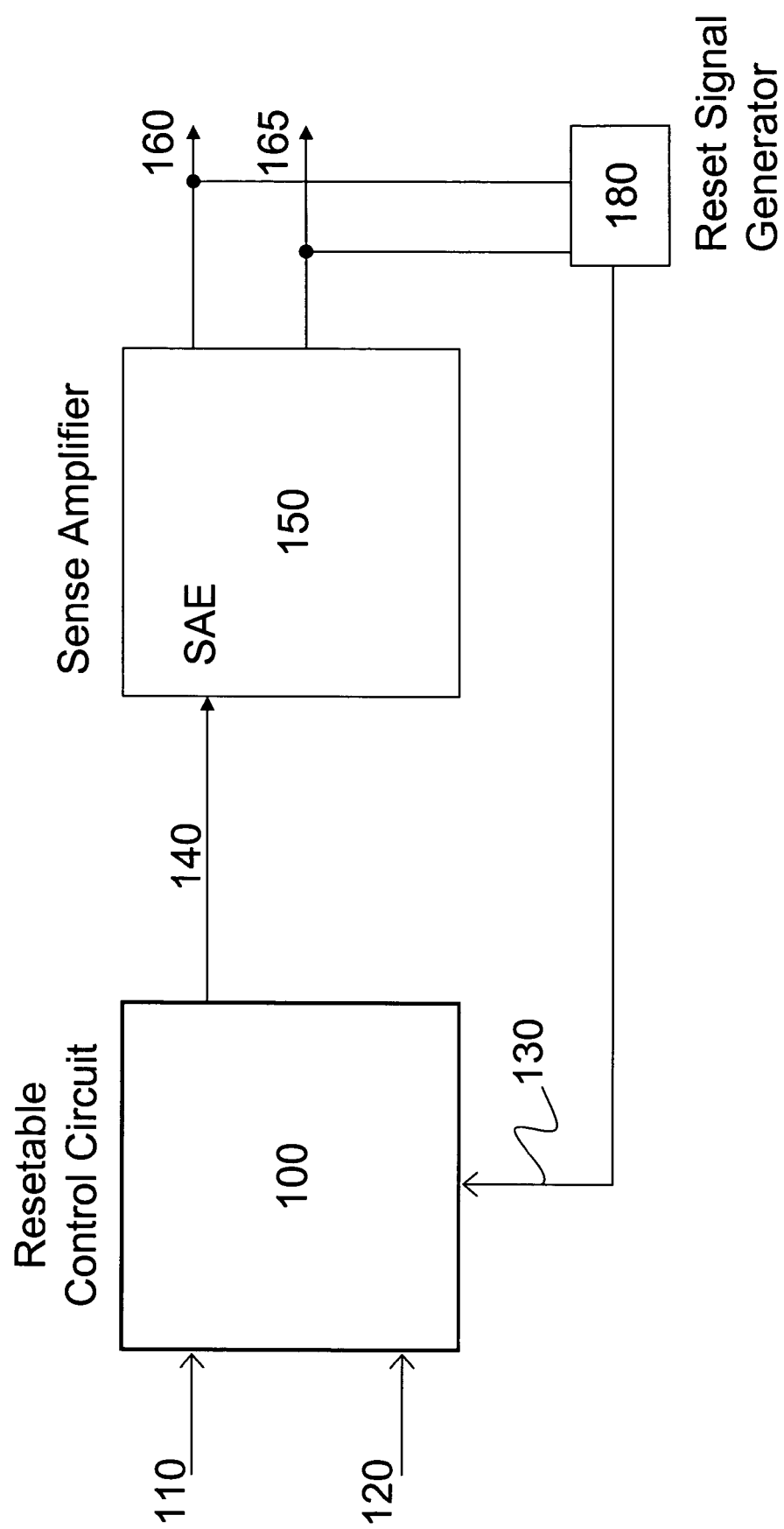
FIG. 1 is a block diagram of a resetable control circuit, a sense amplifier, and a reset signal generator.

As shown in FIG. 1, an exemplary embodiment of a device to control a sense amplifier 150, comprises a resetable control circuit 100 containing a first input 110, a second input 120, a third input 130, and an output 140. The first input 110 is coupled to the output 140 or to a ground. The second input 120 is coupled to receive a start signal. The third input 130 is coupled to receive a reset signal sent from a reset signal generator 180 that performs a logic combination of output signals 160, 165 of the sense amplifier 150. The output 140 is coupled to the sense amplifier 150 as a sense amplifier enabling signal (SAE). In an alternative embodiment, the first input 110 is coupled to a ground voltage level.

The resetable control circuit 100 is employed to control the sense amplifier 150. Initially, the first input 110, the second input 120, and the third input 130 are low. As a result, the output 140 is low. The sense amplifier 150 is off. When a start signal, for example a pulse, comes in, the second input 120 goes high and then goes low again. Consequently, the output 140 goes high. The sense amplifier 150 turns on to differentiate output voltages between OUT 160 and OUTB 165. The OUT 160 and OUTB 165 are coupled to a reset signal generator 180. After either OUT 160 or OUTB 165 reaches a predetermined low voltage level, the reset signal generator 180 sends a reset signal to the resetable control circuit 100 as the third input 130. As a result, the output 140 is reset to a low voltage level and turns off sense amplifier 150. Briefly, through the resetable control circuit 100, the sense amplifier 150 turns on when a start signal triggers the resetable control circuit 100; the sense amplifier 150 turns off soon after either OUT 160 or OUTB 165 reaches a predetermined low voltage level.

Figure 2:
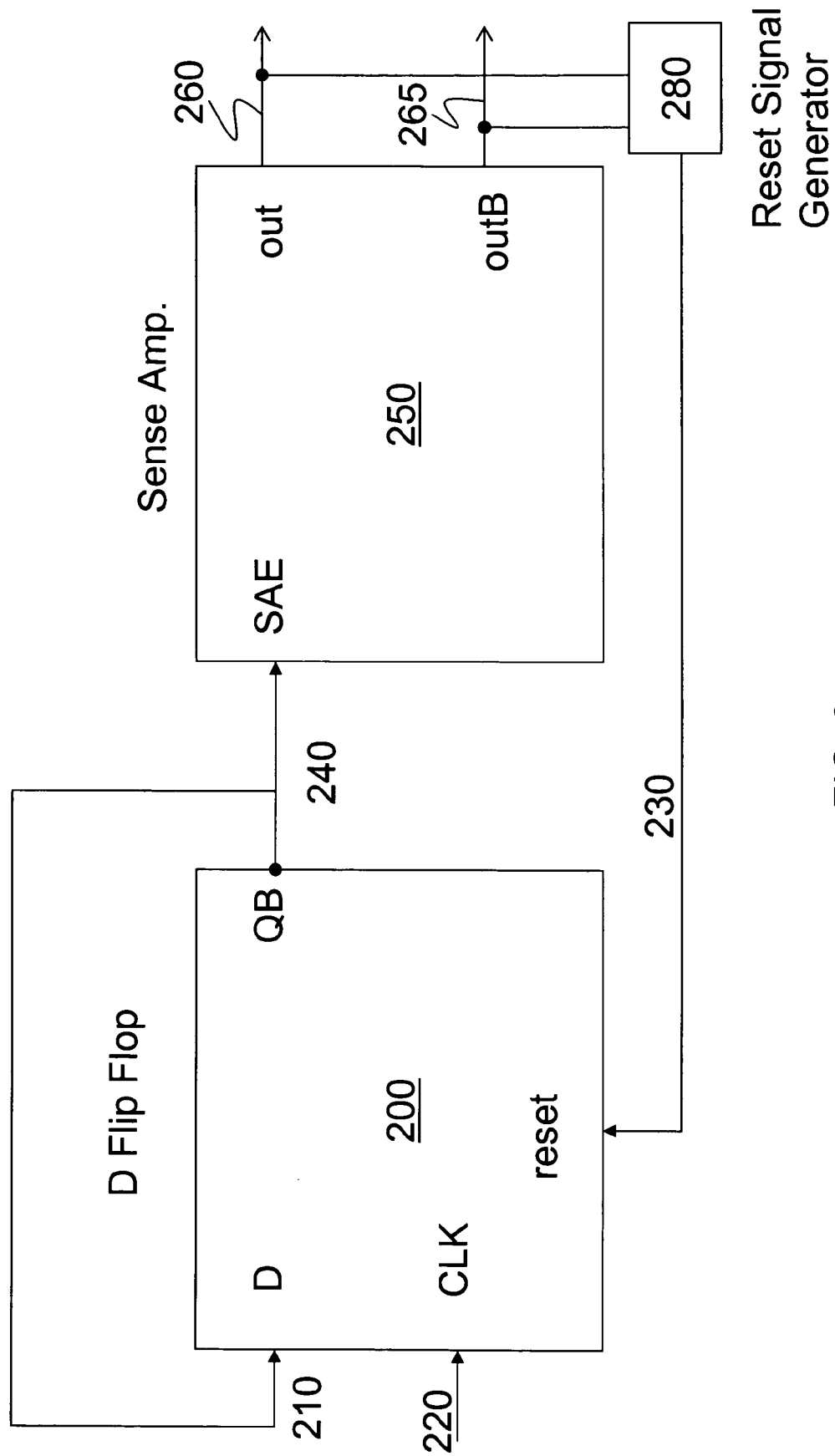
FIG. 2 is a block diagram of one embodiment of a D flip-flop circuit, a sense amplifier, and a reset signal generator.
Figure 3:
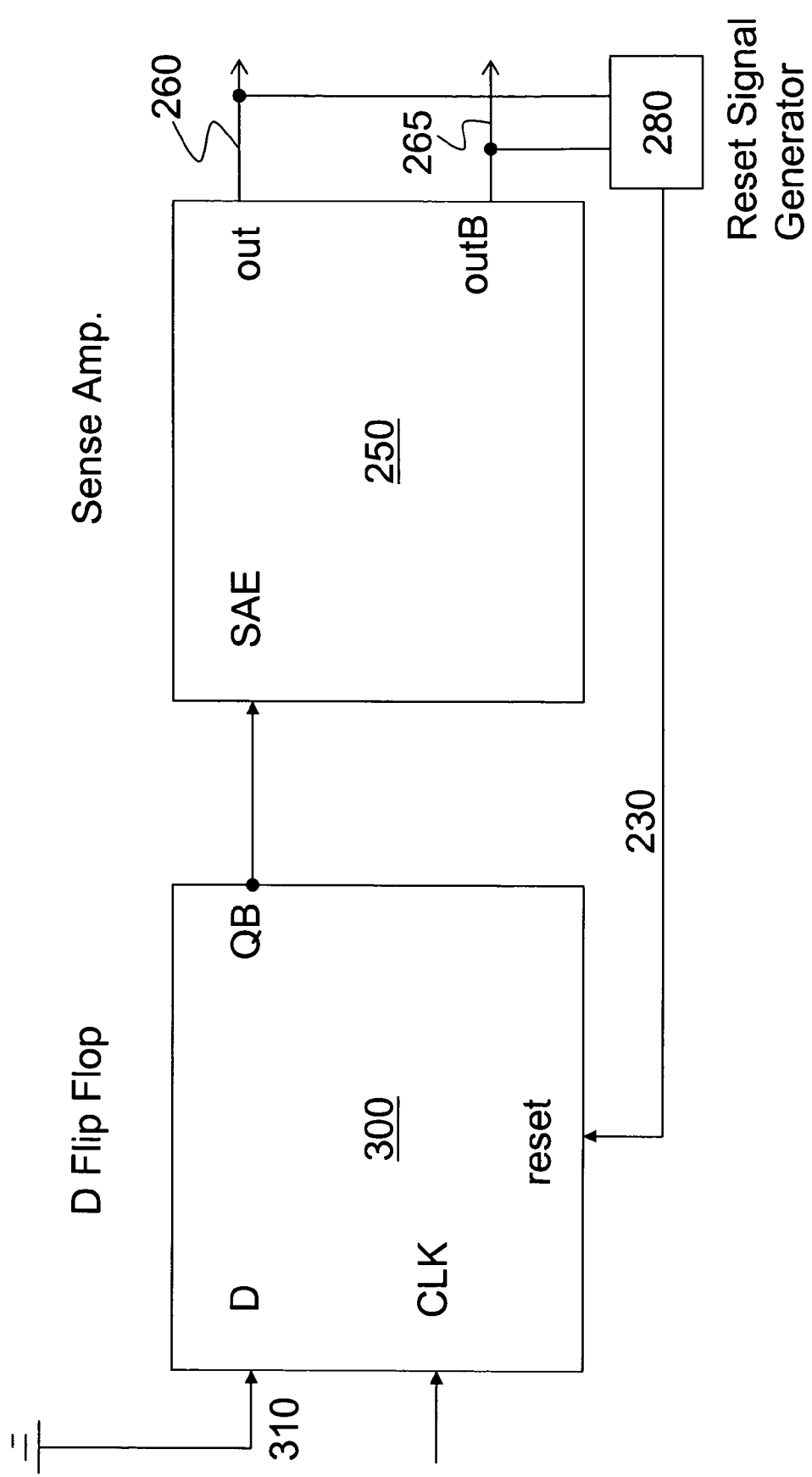
FIG. 3 is a block diagram of another embodiment of a D flip-flop circuit, a sense amplifier, and a reset signal generator.

FIG. 2 illustrates one embodiment that employs a D flip-flop circuit 200 to control a sense amplifier 250. A data signal input 210 of the D flip-flop circuit 200 is coupled to an output 240 of the D flip flop 200. A clock signal input 220 of the D flip flop circuit 200 is coupled to receive a start signal such as a pseudo word line signal. A reset signal input 230 is coupled to a reset signal generator 280. An output 240 of the D flip-flop circuit 200 is coupled to sense amplifier 250 as a SAE. In another embodiment as shown in FIG. 3, an data signal input 310 is coupled to a ground voltage level.

Likewise, the D flip-flop circuit 200 is used to control the sense amplifier 150. Initially, the data signal input 210, the clock signal input 220, and the reset signal input 230 are low. As a result, the output 240 is low. The sense amplifier 250 is off. When a start signal, for example a pseudo word line signal, comes in, the clock signal input 220 goes high and then goes low again. Consequently, the output 240 goes high. The sense amplifier 150 turns on to differentiate output voltages between OUT 260 and OUTB 265. The OUT 260 and OUTB 265 are coupled to a reset signal generator 280. After either OUT 260 or OUTB 265 reaches a predetermined low voltage level, the reset signal generator 280 sends a reset signal to the reset signal input 230 of the D flip-flop circuit 200. As a result, the output 240 is reset to a low voltage level and the sense amplifier 150 turns off.

Figure 4:
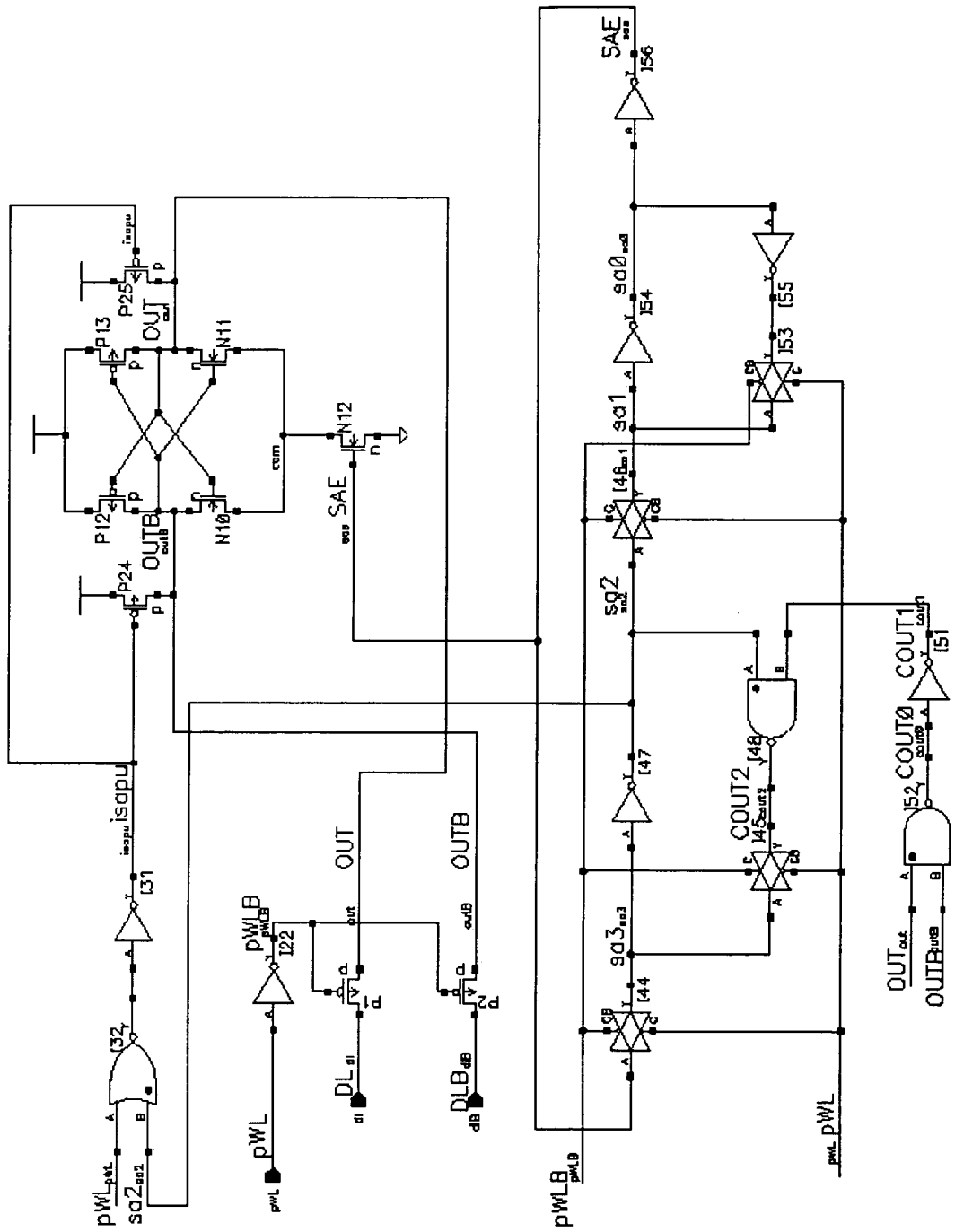
FIG. 4 illustrates a circuit layout of one embodiment of a D flip-flop circuit, a sense amplifier, a reset signal generator, and related circuits.

The circuit layout of one embodiment of the D flip-flop circuit 200 is illustrated in FIG. 4. In addition to a first input 410, a second input 420, a third input 430, and an output 440, a resetable control circuit in this embodiment further comprises a first passgate 450, a second passgate 452, a third passgate 454, and fourth passgate 456; a first inverter 460, a second inverter 462, a third inverter 464, a fourth inverter 466, a fifth inverter 468, and a sixth inverter 470; and a first NAND gate 480.

A passgate has four ends—an input end, an output end, a C end, and a CB end. C end and CB end function as a switch of the passgate. A signal coupled to the CB end is the logic complementary voltage of the signal coupled to the C end. When C ends goes high, a pass-gate turns on and the signal is passed from the input end to the output end.

The first input 410 of the resetable control circuit is coupled to an input end of the first passgate 450. An output end of the first passgate 450 is coupled to an output end of the second passgate 452 and to an input end of the third inverter 464. When the first passgate is on, the second passgate is off. As a result, the input end of third inverter 464 receives signal from the input 410 of the resetable control circuit. However, when the first passgate is off, the second passgate is on. Accordingly, the input end of the third inverter 464 receives a signal from the output end of the NAND gate 480.

The second input 420 of the resetable control circuit is coupled to an input end of the first inverter 460; a C end of the first passgate 450, a CB end of the second passgate 452, a CB end of the third passgate 454, and a C end of the fourth passgate 456. An output end of the first inverter 460 is coupled to a CB end of the first passgate, a C end of the second passgate, a C end of the third passgate, and a CB end of the fourth passgate. That is to say, the second input 420 and its logic complementary signal 425 (the output of the first inverter 460), together control switches of four passgates.

The third input 430 of the resetable control circuit is coupled to an input end of the second inverter 462. The third input 430 receives a signal from a NAND gate 485 that performs a NAND operation on OUT and OUTB of a sense amplifier. The NAND gate 485 is one embodiment of a reset signal generator that sends out a reset signal after either OUT or OUTB of the sense amplifier reaches a predetermined low voltage level. Other designs of a reset signal generator are known to people with ordinary skill in the art.

An output of the third inverter 464 is coupled to a first input end of the first NAND gate 480 and an input end of the third passgate 454. An output end of the second inverter 462 is coupled to a second input end of the first NAND gate 480. An output end of the first NAND gate 480 is coupled to an input end of the second passgate 452.

An output end of the third passgate 454 is coupled to an input end of the fourth inverter 466 and to an output end of the fourth passgate 456. When the third passgate 454 is on, the fourth passgate 456 is off. As a result, the input end of fourth inverter 466 receives a signal from the output end of third inverter 464. However, when the third passgate 454 is off, the fourth passgate 456 is on. Accordingly, the input end of the fourth inverter 466 receives a signal from the output end of the fifth inverter 468.

An output end of the fourth inverter 466 is coupled to an input end of the fifth inverter 468 and to an input end of the sixth invertor 470. An output end of the fifth inverter 468 is coupled to an input end of the fourth passgate 456. An output end of the sixth inverter 470 is coupled to the output 440 of the resetable control circuit. The output 440 is coupled to the sense amplifier to control its on and off.

Initially, the output 440 is low; the first input 410 is low; the second input 420 is low; the third input 430 is low. When a start signal, such as a pseudo word line signal, comes in from the second input 420. The second input 420 goes high first and goes low again. When the second input 420 goes high, the first and fourth passgates are open; the second and third passgates are closed. As a result, the output end of the third inverter 464 goes high. When the second input 420 goes low again, the first and fourth passgates are closed; the second and third passgates are open. The output 440 goes high and turns on the sense amplifier.

When either OUT or OUTB reaches a predetermined low voltage level, the third input 430 goes high. The output end of the first NAND gate has high voltage level. At this time, because the second passgate is open, the output end of the third inverter 464 becomes low. Consequently, the output 440 becomes low voltage level and the sense amplifier turns off. The output of this circuit embodiment is reset to its initial condition. When next start signal comes in, it triggers another cycle of the operation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A device to control a sense amplifier, comprising:
   a resetable control circuit containing a first input, a second input, a third input, and an output; said first input coupled to said output or to a ground; said second input coupled to receive a start signal; said third input coupled to receive output signals of said sense amplifier; and said output coupled to said sense amplifier;
   a reset signal generator, containing a first input coupled to an OUT end of said sense amplifier, a second input coupled to an OUTB end of said sense amplifier, and an output coupled to said third input of said resetable control circuit; and when either OUT or OUTB reaches a predetermined low voltage level, said output of said reset signal generator goes high.

2. The device of claim 1 wherein said resetable control circuit is a flip-flop circuit.

3. The device of claim 2 wherein said flip-flop circuit is a D flip-flop circuit.

4. The device of claim 3 wherein said first input is a data signal for said D flip-flop circuit.

5. The device of claim 3 wherein said start signal is a triggered clock for said D flip-flop circuit.

6. The device of claim 5 wherein said start signal is a pseudo word line signal.

7. The device of claim 3 wherein said third input is a reset signal for said D flip-flop circuit.

8. The device of claim 3 wherein said resetable control circuit further comprises a first passgate, a second passgate, a third passgate, and fourth passgate; a first inverter, a second inverter, a third inverter, a fourth inverter, a fifth inverter, and a sixth inverter; and a first NAND gate;
   said first input of said resetable control circuit coupled to an input end of said first passgate, an output end of said first passgate coupled to an output end of said second passgate and an input end of said third inverter;

said second input of said resetable control circuit coupled to an input end of said first inverter; a C end of said first passgate, a CB end of said second passgate, a CB end of said third passgate, and a C end of said fourth passgate;

said third input of said resetable control circuit coupled to an input end of said second inverter;

an output end of said first inverter coupled to a CB end of said first passgate, a C end of said second passgate, a C end of said third passgate, and a CB end of said fourth passgate;

an output end of said third inverter coupled to a first input end of said first NAND gate and to an input end of said third passgate;

an output end of said second inverter coupled to a second input end of said first NAND gate, an output end of said first NAND coupled to an input end of said second passgate;

an output end of said third passgate coupled to an input end of said fourth inverter and to an output end of said fourth passgate;

an output end of said fourth inverter coupled to an input end of said fifth inverter and to an input end of said sixth inverter;

an output end of said fifth inverter coupled to an input end of said fourth passgate;

an output end of said sixth inverter coupled to said output of said resetable control circuit.

9. The device of claim 8, further comprising:

a reset signal generator, containing a NAND gate, a first input of said NAND gate, a second input of said NAND gate, an output of said NAND gate;

said first input coupled to an OUT end of said sense amplifier, said second input coupled to an OUTB end of said sense amplifier, and said output coupled to said third input of said resetable control circuit.

10. A device to control a sense amplifier, comprising:

a flip flop circuit containing a first input, a second input, a third input, and an output; said first input coupled to said output; said second input coupled to receive a start signal; said third input coupled to receive output signals of said sense amplifier; and said output coupled to said sense amplifier;

wherein said flip-flop circuit is a D flip-flop circuit and said first input is a data signal for said D flip-flop circuit.

11. The device of claim 10 wherein said first input, said second input, said third input, and said output are initially low; when said second input goes high and then goes low again, said output goes high; when said third input goes high, said output goes low.

12. The device of claim 10 further comprising:

a reset signal generator, containing a first input coupled to an OUT end of said sense amplifier, a second input coupled to an OUTB end of said sense amplifier, and an output coupled to said third input of said resetable control circuit; and when either OUT or OUTB reaches a predetermined low voltage level, said output of said reset signal generator goes high.

13. The device of claim 10 wherein said start signal is a triggered clock for said D flip-flop circuit.

14. The device of claim 10 wherein said start signal is a pseudo word line signal.

15. The device of claim 10 wherein said third input is a reset signal for said D flip-flop circuit.

16. The device of claim 10 wherein said first input being a data signal for said D flip-flop, said second input being a-triggered clock for said D flip-flop, said third input being a reset signal for said D flip-flop, and said output are initially low; when said triggered clock goes high and then goes low again, said output goes high; when said reset signal goes high, said output goes low.

17. The device of claim 10 wherein said flip flop circuit further comprises a first passgate, a second passgate, a third passgate, and fourth passgate; a first inverter, a second inverter, a third inverter, a fourth inverter, a fifth inverter, and a sixth inverter; and a first NAND gate;

said first input of said circuit coupled to an input end of said first passgate, an output end of said first passgate is coupled to an output end of said second passgate and an input end of said third inverter;

said second input of said circuit coupled to an input end of said first inverter; a C end of said first passgate, a CB end of said second passgate, a CB end of said third passgate, and a C end of said fourth passgate;

said third input of said circuit coupled to an input end of said second inverter;

an output end of said first inverter coupled to a CB end of said first passgate, a C end of said second passgate, a C end of said third passgate, and a CB end of said fourth passgate;

an output end of said third inverter coupled to a first input end of said first NAND gate and to an input end of said third passgate;

an output end of said second inverter coupled to a second input end of said first NAND gate, an output end of said first NAND gate coupled to an input end of said second passgate;

an output end of said third passgate coupled to an input end of said fourth inverter and to an output end of said fourth passgate;

an output end of said fourth inverter coupled to an input end of said fifth inverter and to an input end of said sixth inverter;

an output end of said fifth inverter coupled to an input end of said fourth passgate;

an output end of said sixth inverter coupled to said output of said resetable control circuit.

18. The device of claim 17, further comprising:

a reset signal generator, containing a NAND gate, a first input of said NAND gate, a second input of said NAND gate, an output of said NAND gate;

said first input coupled to an OUT end of said sense amplifier, said second input coupled to an OUTB end of said sense amplifier, and said output coupled to said third input of said resetable control circuit.

19. A device to control a sense amplifier, comprising:

a D flip flop circuit containing a first input, a second input, a third input, and an output; said first input coupled to said output or to a ground; said second input coupled to receive a start signal; said third input coupled to receive output signals of said sense amplifier; and said output coupled to said sense amplifier;

a first passgate, a second passgate, a third passgate, and fourth passgate; a first inverter, a second inverter, a third inverter, a fourth inverter, a fifth inverter, and a sixth inverter; and a first NAND gate;

said first input of said circuit coupled to an input end of said first passgate, an output end of said first passgate coupled to an output end of said second passgate and an input end of said third inverter;

said second input of said circuit coupled to an input end of said first inverter; a C end of said first passgate, a CB end of said second passgate, a CB end of said third passgate, and a C end of said fourth passgate;

said third input of said circuit coupled to an input end of said second inverter;

an output end of said first inverter coupled to a CB end of said first passgate, a C end of said second passgate, a C end of said third passgate, and a CB end of said fourth passgate;

an output end of said third inverter coupled to a first input end of said first NAND gate and to an input end of said third passgate;

an output end of said second inverter coupled to a second input end of said first NAND gate, an output end of said first NAND coupled to an input end of said second passgate;

an output end of said third passgate coupled to an input end of said fourth inverter and to an output end of said fourth passgate;

an output end of said fourth inverter coupled to an input end of said fifth inverter and to an input end of said sixth inverter;

an output end of said fifth inverter coupled to an input end of said fourth passgate;

an output end of said sixth inverter coupled to said output of said resetable control circuit.

20. The device of claim 19, further comprising:

a reset signal generator, containing a NAND gate, a first input of said NAND gate, a second input of said NAND gate, an output of said NAND gate;

said first input coupled to an OUT end of said sense amplifier, said second input coupled to an OUTB end of said sense amplifier, and said output coupled to said third input of said resetable control circuit.

* * * * *